(12) United States Patent
Carpenter

(10) Patent No.: US 8,134,817 B2
(45) Date of Patent: Mar. 13, 2012

(54) ELECTROSTATIC DISCHARGE CONDUCTING PATHWAY HAVING A NOISE FILTER SPARK GAP

(75) Inventor: John Allen Carpenter, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 517 days.

(21) Appl. No.: 12/190,522

(22) Filed: Aug. 12, 2008

(65) Prior Publication Data

US 2010/0039838 A1 Feb. 18, 2010

(51) Int. Cl.
*H02H 9/04* (2006.01)
(52) U.S. Cl. ............................... 361/112; 361/56; 363/52
(58) Field of Classification Search ........................ None
See application file for complete search history.

(56) References Cited

U.S. PATENT DOCUMENTS 5,995,353 A * 11/1999 Cunningham et al. ........ 361/111

* cited by examiner

*Primary Examiner* — Jared Fureman
*Assistant Examiner* — Angela Brooks
(74) *Attorney, Agent, or Firm* — Blakely Sokoloff Taylor & Zafman LLP

(57) ABSTRACT

A printed circuit board includes a primary region, a secondary region and an isolation region disposed between the primary region and the secondary region to galvanically isolate the primary region from the secondary region. The primary region is to be coupled to an AC source. The primary region also includes an electrostatic discharge (ESD) conducting pathway to redirect current to the AC source that crosses the isolation region. A spark gap is included in the ESD conducting pathway to filter noise and to provide a current path to the AC source for the current that crosses the isolation region.

23 Claims, 5 Drawing Sheets

ELECTROSTATIC DISCHARGE CONDUCTING PATHWAY HAVING A NOISE FILTER SPARK GAP

TECHNICAL FIELD

This disclosure relates generally to the layout of a printed circuit board, and in particular but not exclusively, relates to the layout of a printed circuit board having an electrostatic discharge conducting pathway.

BACKGROUND INFORMATION

Many electrical devices such as cell phones, personal digital assistants (PDA's), laptops, etc. are powered by a source of relatively low-voltage DC power. Because power is generally delivered through a wall outlet as high-voltage AC power, a device typically referred to as a power supply or power converter is required to transform the high-voltage AC power to low-voltage DC power.

Power supplies are typically constructed by mounting electrical components onto a printed circuit board (PCB). One specific type of power supply configuration is an isolated power supply which galvanically isolates the input side from the output side of the power supply. More specifically, galvanic isolation occurs when DC current is unable to flow between the input side and output side of the power supply. One of the electrical components that is typically included in an isolated power supply is a transformer. The transformer allows the transfer of energy between an input side (referred to as a primary side) of the power supply and an output side (referred to as the secondary side) of the power supply while maintaining the galvanic isolation.

In general, power supplies include electrical circuitry that may be sensitive to electrostatic discharge (ESD). During an ESD event a charge difference increases between two objects until a sudden and momentary current is released. In other words, when a charge difference between the two objects exceeds a threshold, a current will be discharged by taking the path of least resistance between the two objects to reduce the charge difference between them. A familiar example of ESD is an electric shock one feels after walking across a carpet and then touching a metal object.

Due to the sudden current created by an ESD event, circuit functionality of an electrical device may be disrupted. In addition, other effects on electrical circuitry may include: diminishing functionality of electrical capacitors, melting of bonding wires and/or other semiconductor material, occurrences of short circuits between traces, and increasing temperature of semiconductor devices. Therefore, considerations are taken to limit and/or prevent the effect of ESD on circuitry particularly sensitive to ESD.

During an ESD event in an isolated power supply (e.g., a charged person touches the output of the power supply), a charge difference builds up between the primary and secondary sides of the power supply. If the charge difference is large enough, current may begin to flow between the secondary and primary sides of the power supply. In an effort to protect sensitive circuitry on the primary side from a potential ESD event, it is common to use an ESD conducting pathway to redirect unwanted sudden or momentary currents into an AC source coupled to the input of the power supply. Thus, during an ESD event unwanted currents will exit the power supply through this ESD conducting pathway thereby reducing the risk of damage/interference with the sensitive circuitry on the primary side of the power supply.

During power supply operation, electrical components included in the power supply, such as a transformer, may pollute nearby circuitry with unwanted electrical noise. The ESD conducting pathway may occupy a location on the PCB that allows for this electrical noise to be picked up. Electrical noise, hereon referred to as noise, may include any unwanted disturbance in the power supply, such as voltages or currents. For example, during power supply operation, the ESD conducting pathway may be exposed to changing electrical and/or magnetic fields created by electrical circuitry which may generate additional currents through the ESD conducting pathway.

Therefore, the alternative pathway for redirecting ESD may introduce noise generated from the power supply circuitry that is also redirected back to the AC source along with unwanted currents from an ESD event. By injecting additional noise back into the AC source, the power supply may produce more electromagnetic interference (EMI) than permitted by regulatory standards.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Examples related to an electrostatic discharge (ESD) pathway included on a printed circuit board are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example" or "an example" means that a particular feature, structure or characteristic described in connection with the embodiment is included in at least one embodiment or example of the present invention. Thus, the appearances of the phrases "in one embodiment," "in an embodiment," "in one example" or "in an example" in various places throughout this specification are not necessarily all referring to the same embodiment. The particular features, structures or characteristics may be combined for example into any suitable combinations and/or sub-combinations in one or more embodiments or examples. In addition, it is appreciated that the figures provided herewith are for explanation purposes to persons ordinarily skilled in the art and that the drawings are not necessarily drawn to scale.

As will be illustrated, embodiments of the present invention include examples of an electrostatic discharge (ESD) pathway included on a printed circuit board (PCB). The ESD pathway includes a spark gap that prevents noise from coupling to the ESD pathway and returning to the AC source.

Figure 1:
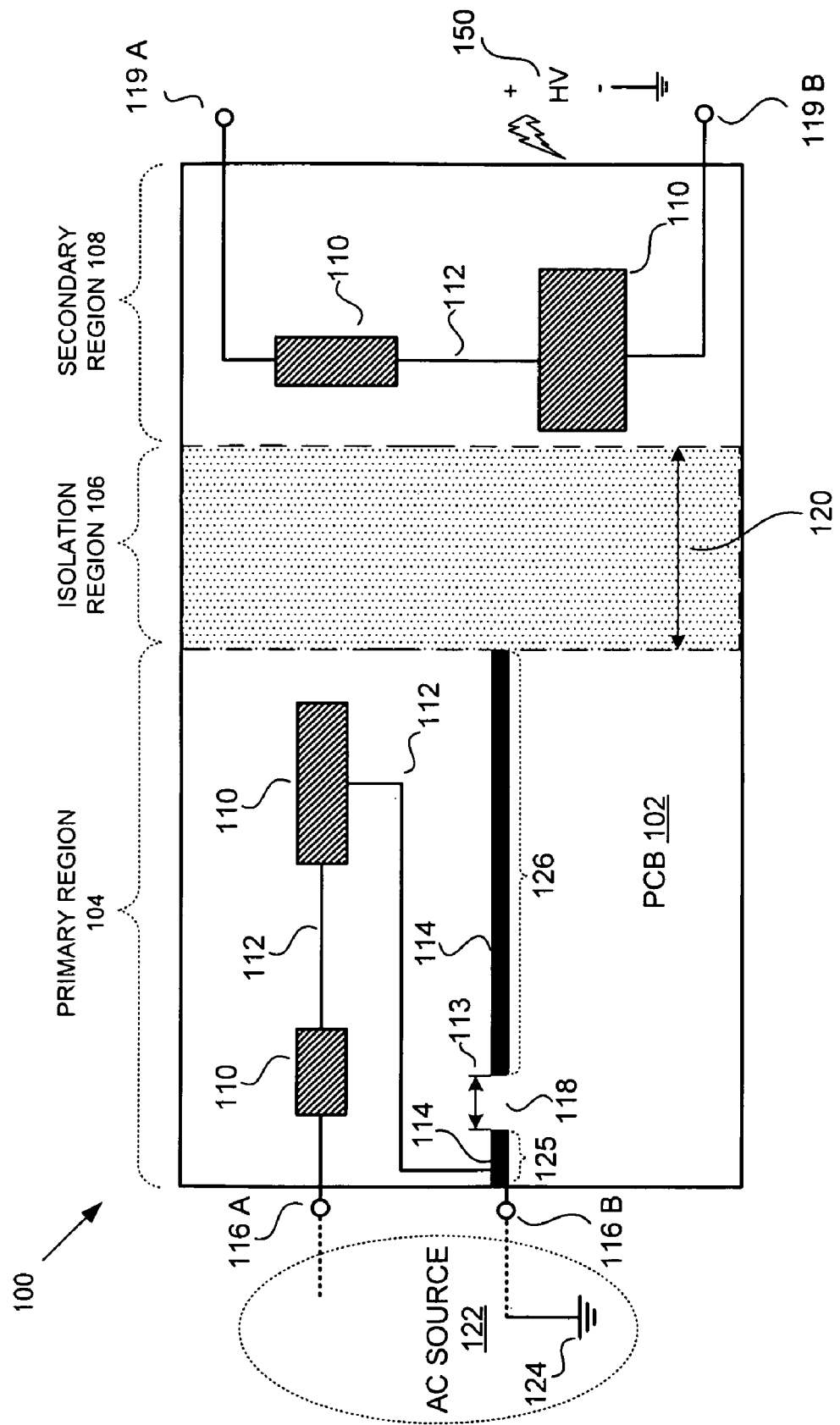
FIG. 1 is a functional diagram illustrating a printed circuit board layout, in accordance with the teachings of the present invention.

FIG. 1 is a functional diagram illustrating a printed circuit board layout 100, in accordance with the teachings of the present invention. The illustrated example of printed circuit board layout 100 includes a printed circuit board (PCB) 102. PCB 102 is illustrated as including a primary region 104, an isolation region 106, and a secondary region 108. As shown, a plurality of electrical components 110 and traces 112 are included in primary region 104 and secondary region 108. FIG. 1 also shows primary region 104 as including an electrostatic discharge (ESD) conducting pathway 114 and input terminals 116A and 116B. As shown, input terminals 116A and 116B function as an interface to enable coupling of AC source 122 to PCB 102. In one example, input terminals 116A and 116B may extend outward from PCB 102. In another example, input terminals 116A and 116B may be conducting areas of metal mounted to PCB 102. ESD conducting pathway 114 is shown as including a spark gap 118. FIG. 1 also shows secondary region 108 as including output terminals 119A and 119B.

As shown in FIG. 1, isolation region 106 is disposed between primary region 104 and secondary region 108 to galvanically isolate primary region 104 from secondary region 108. More specifically, galvanic isolation is achieved when DC current is unable to flow between the input side and output side of the power supply. In one example, isolation region 106 contains substantially no conductive materials.

Primary and secondary regions 104 and 108 are configured to receive electrical components 110. Electrical components 110 may include passive components such as, but not limited to, resistors, capacitors, diodes, and inductors. Electrical components 110 may also include active components such as, but not limited to, transistors, integrated circuits, or other semiconductor devices. In one example, one or more electrical components 110 included in primary region 104 are substantially sensitive to ESD. Metal traces 112 are formed on primary and secondary regions 104 and 108 to interconnect various electrical components 110 and/or to connect electrical components 110 to electrical terminals, such as input terminals 116A and 116B and output terminals 119A and 119B. In one example, electrical components 110 and metal traces 112 are arranged on PCB 102 to form a power supply circuit. In the illustrated example, input terminals 116A and 116B are coupled to an AC source 122, where input terminal 116B is to be coupled to an electrical ground 124 of AC source 122. In one example, output terminals 119A and 119B are to be coupled to another electrical circuit (not shown).

As shown, FIG. 1 illustrates a high voltage source (HV) 150 coupling to secondary region 108. In other words, high voltage source HV 150 may include a highly positively charged object coming in contact with secondary region 108. High voltage source HV 150 may be sources such as, but not limited to, a human body, a charged device, and/or a machine. In another aspect, high voltage source HV 150 may be of a magnitude greater than the breakdown voltage between two isolated portions of electrical circuitry in an electrical device. More specifically, a breakdown voltage is reached when the insulation (e.g., air) between two conductors will break down and conduct current. In one example, high voltage source HV 150 may be of magnitude greater than 15 kV. High voltage source 150 may be introduced to any exposed area of secondary region 108. In one example, high voltage source HV 150 may be introduced at output terminals 119A or 119B in the secondary region 108.

As shown, ESD conducting pathway 114 is placed such that an alternative pathway to input terminal 116B is provided for any unwanted currents that cross isolation region 106 during an ESD event. In other words, during an ESD event energy from high voltage source 150 that crosses isolation region 106 will be transferred to ESD conducting pathway 114 instead of through electrical components 110 and/or metal traces 112 in primary region 104.

FIG. 1 further illustrates spark gap 118 as included in ESD conducting pathway 114 to galvanically isolate AC source 122 from a segment of ESD conducting pathway 114. In one example, spark gap 118 may include substantially insulative material. More specifically, ESD conducting pathway 114 is illustrated as including spark gap 118 disposed between a first segment 125 and a second segment 126. Spark gap 118 is designed with a high enough breakdown voltage to substantially prevent noise from electrical circuitry 110 from coupling to input terminal 116B, and with a low enough breakdown voltage to allow energy transferred from high voltage source HV 150 to conduct through spark gap 118 to reach electrical ground 124. Therefore, spark gap 118 effectively functions as a filter by preventing the coupling of noise, subsequently measured as electromagnetic interference (EMI), from exiting through AC source 122 while still allowing a pathway for currents generated by ESD events. In one example, the breakdown voltage of spark gap 118 may be substantially less than the breakdown voltage between ESD conducting pathway 114 and any of the electrical components 110 or metal traces 112, such that spark gap 118 is the path of least resistance to electrical ground 124. In one example, spark gap 118 provides a current path to input terminal 116B only in response to an ESD event.

In one example, spark gap 118 has a width 113 that is substantially smaller than a width 120 of isolation region 106. For example, width 113 of spark gap 118 is approximately 0.28 mm. In one example, width 120 of isolation region 106 separates electrical circuitry 110 on primary region 104 from electrical circuit 110 on secondary region 108 by a minimum distance in order to meet certain safety standards. For example, width 120 of spark gap 118 is approximately 4.5 mm.

Figure 2:
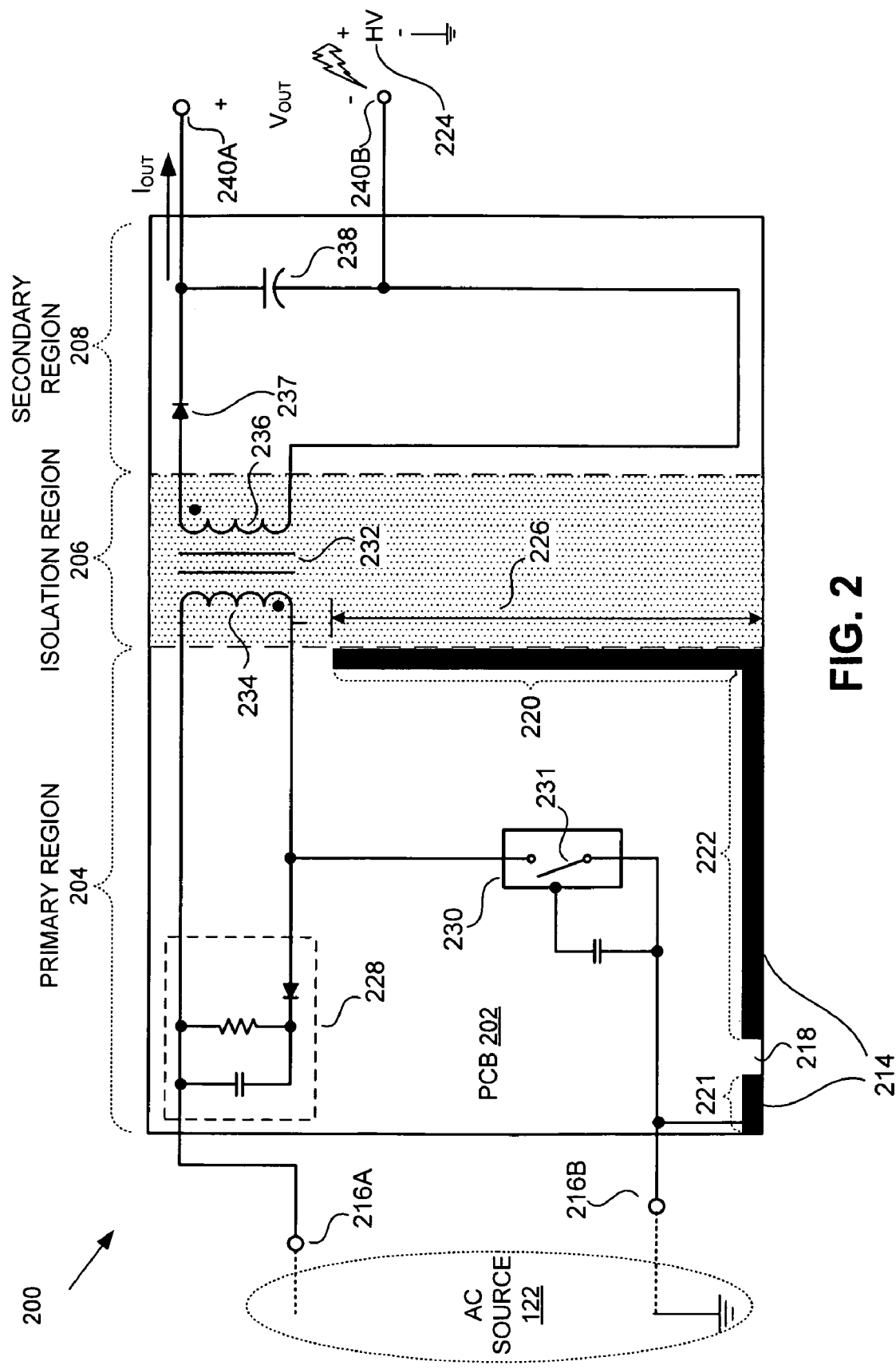
FIG. 2 is a functional diagram illustrating a printed circuit board layout of a power supply including an electrostatic discharge (ESD) conducting pathway, in accordance with the teachings of the present invention.

FIG. 2 is a functional diagram illustrating a printed circuit board layout of a power supply 200, in accordance with the teachings of the present invention. The illustrated example of power supply 200 includes a printed circuit board (PCB) 202. PCB 202 is illustrated as including a primary region 204, an isolation region 206, and a secondary region 208. As shown, primary region 204 includes input terminals 216A and 216B, clamp circuit 228, and a controller 230. FIG. 2 also shows primary region 204 as including an electrostatic discharge (ESD) conducting pathway 214 coupled to input terminal 216B. ESD conducting pathway 214 is illustrated as including a spark gap 218 and segments 220, 221, and 222. Also included in power supply 200 is a transformer 232, which includes a primary winding 234 and a secondary winding 236. As shown, primary winding 234 is coupled to circuitry in primary region 204 and secondary winding 236 is coupled to circuitry in secondary region 208.

As shown, clamp circuit 228 is coupled across primary winding 234 of transformer 232 to limit the maximum voltage across controller 230. A power switch 231 is coupled to control the transfer of energy to output terminals 240A and 240B to regulate and output voltage $V_{OUT}$ or output current $I_{OUT}$ by switching the power switch 231 between an on state and an off state. In one example, power switch 231 is a transistor, such as for example, a high voltage metal oxide semiconductor field effect transistor (MOSFET). In one example, power switch 231 is not integrated into controller 230 and instead is a discrete component coupled to controller 230. A bypass capacitor provides power to the internal circuitry of controller 230 during the off state of power switch 231. In one example, controller 230 produces pulsating currents in the rectifier 237, which in the illustrated example includes a diode that is filtered by a capacitor 238 in secondary region 208 to produce the substantially constant output voltage $V_{OUT}$.

As shown in FIG. 2, ESD conducting pathway 214 is included in primary region 204 to provide a pathway for current from an ESD event to input terminal 216B (which is coupled to a ground terminal of AC source 122). ESD conducting pathway 214 is shown as including segment 220 coupled to segment 222. In the illustrated example, segment 220 is shown as bordering at least a portion of isolation region 206 to function as a protective barrier to circuitry in primary region 204. In one example, segment 220 provides the most 'preferable path' in the event conducting pathways are formed between primary region circuitry and secondary region circuitry by dust and/or other conducting particulates. Segment 222 is illustrated as bordering a periphery of PCB 202 to further ensure that the current from an ESD event is redirected away from the electrical components of the primary region 204. As shown, segment 220 has a length 226 that is less than the length of isolation region 206. In one example spark gap 218 may be placed anywhere along the ESD conducting pathway 214. In another example, spark gap 218 may be placed at the end of ESD conducting pathway such that spark gap 218 is disposed between input terminal 216B and first segment 221 of ESD conducting pathway 214.

Figure 3:
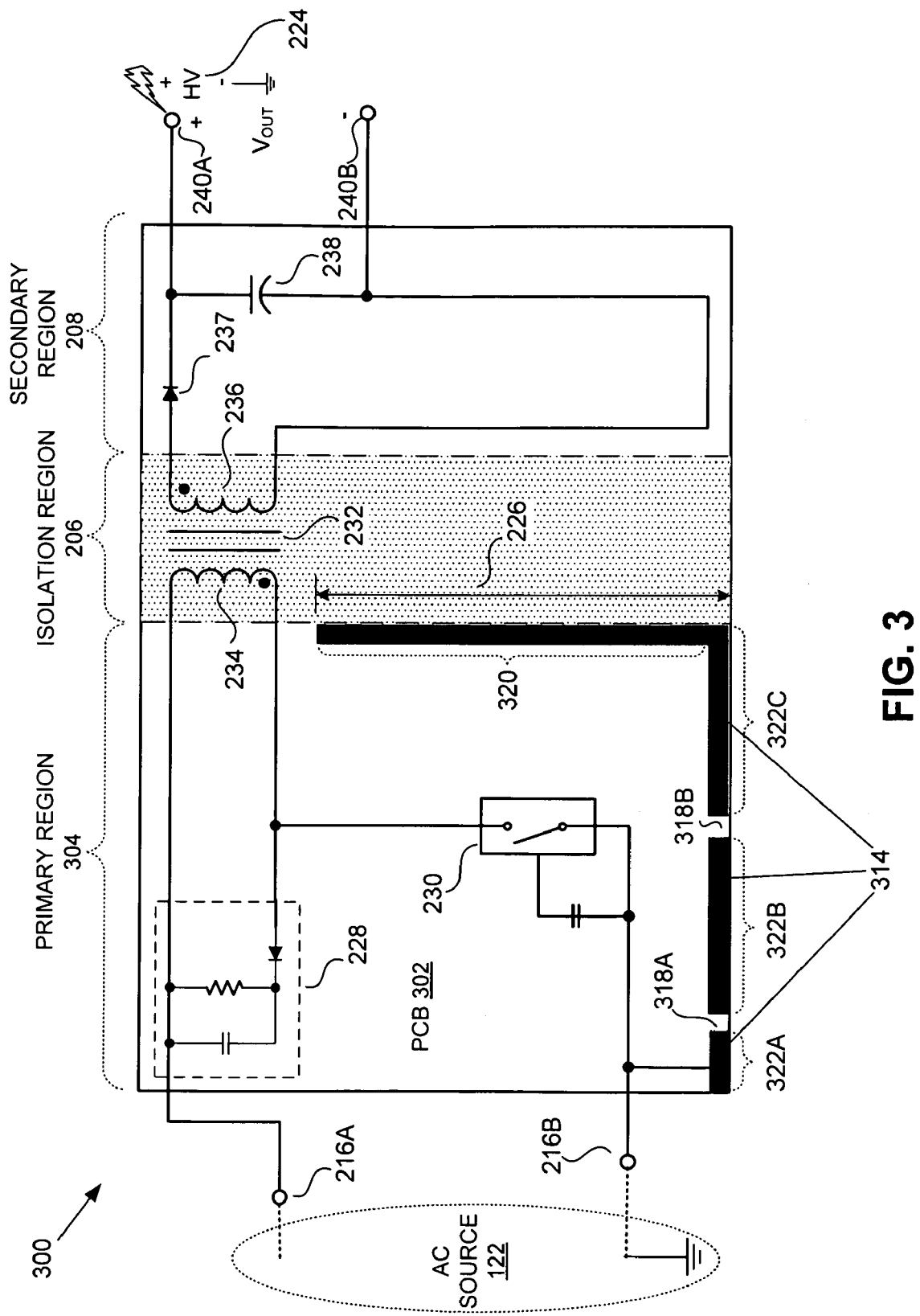
FIG. 3 is a functional diagram illustrating a printed circuit board layout of a power supply including an alternative ESD conducting pathway, in accordance with the teachings of the present invention.

FIG. 3 is a functional diagram illustrating a printed circuit board layout of a power supply 300, in accordance with the teachings of the present invention. The illustrated example of power supply 300 includes a printed circuit board (PCB) 302. PCB 302 is illustrated as including a primary region 304, isolation region 206, and secondary region 208. As shown, primary region 304 includes input terminals 216A and 216B, clamp circuit 228, and controller 230. FIG. 3 also shows primary region 304 as including an electrostatic discharge (ESD) conducting pathway 314 which includes spark gaps 318A and 318B and segments 320, 322A, 322B and 322C.

As shown in FIG. 3, segment 322A is illustrated as coupled to input terminal 216B. Segment 322C is illustrated as coupled to segment 320. Spark gap 318A is disposed between segments 322A and 322B and spark gap 318B is disposed between segments 322B and 322C. Although FIG. 3 illustrates ESD conducting pathway 314 as including two spark gaps 318A and 318B, any number, including one or more spark gaps may be included in ESD conducting pathway 314.

Figure 4:
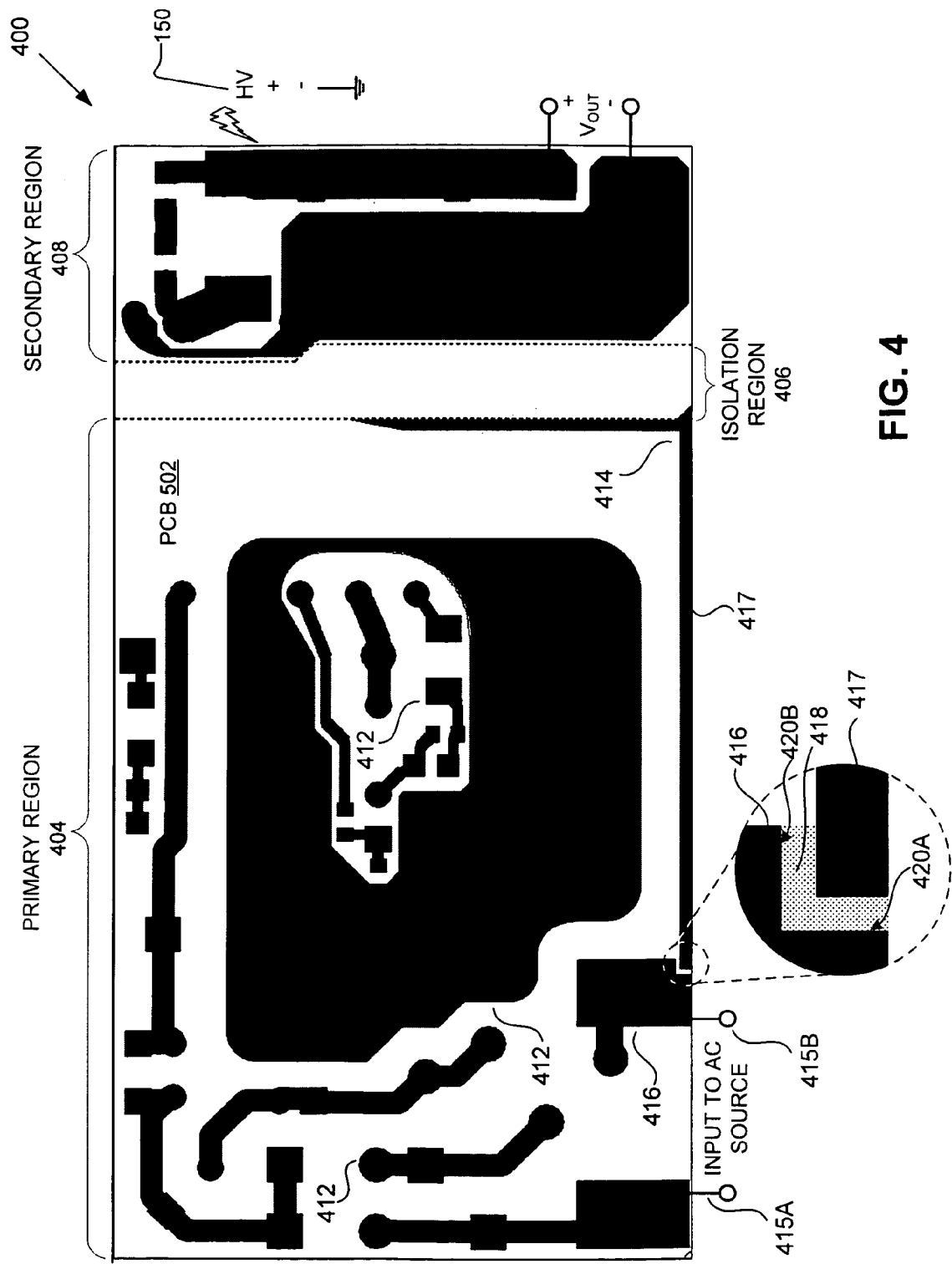
FIG. 4 is an example printed circuit board layout of a power supply including an ESD conducting pathway, in accordance with the teachings of the present invention.

FIG. 4 is a diagram illustrating a printed circuit board (PCB) layout 400 of a power supply, in accordance with the teaching of the present invention. The illustrated example of PCB layout 400 illustrates a primary region 404, an isolation region 406, and a secondary region 408. As shown in FIG. 4, primary region 404 includes traces 412, input terminals 415A and 415B, and an electrostatic discharge (ESD) conducting pathway 414. ESD conducting pathway 414 is illustrated as including a ground portion 416, a floating portion 417, and a spark gap 418. More specifically, ground portion 416 may be electrically grounded when ground portion 416 is coupled to AC source 122. As shown, ground portion 416 includes edges 420A and 420B, and is coupled to input terminal 416B.

As shown in FIG. 4, spark gap 418 is located between a floating portion 417 of ESD conducting pathway 414 and at least two edges 420A and 420B of grounded portion 416. Floating portion 417 of ESD conducting pathway 414 is not electrically grounded, therefore no noise from electrical circuitry in primary region 404 and/or secondary region 408 will be coupled to floating portion of 417 of ESD conducting pathway 414.

According to embodiments of the present invention, any of the spark gaps discussed herein (i.e., 118, 218, 318A, 318B, or 418) may filter something other than noise. In particular, a spark gap according to embodiments of the present invention may be designed to filter out a specific signal by adjusting the width of the spark gap.

Figure 5:
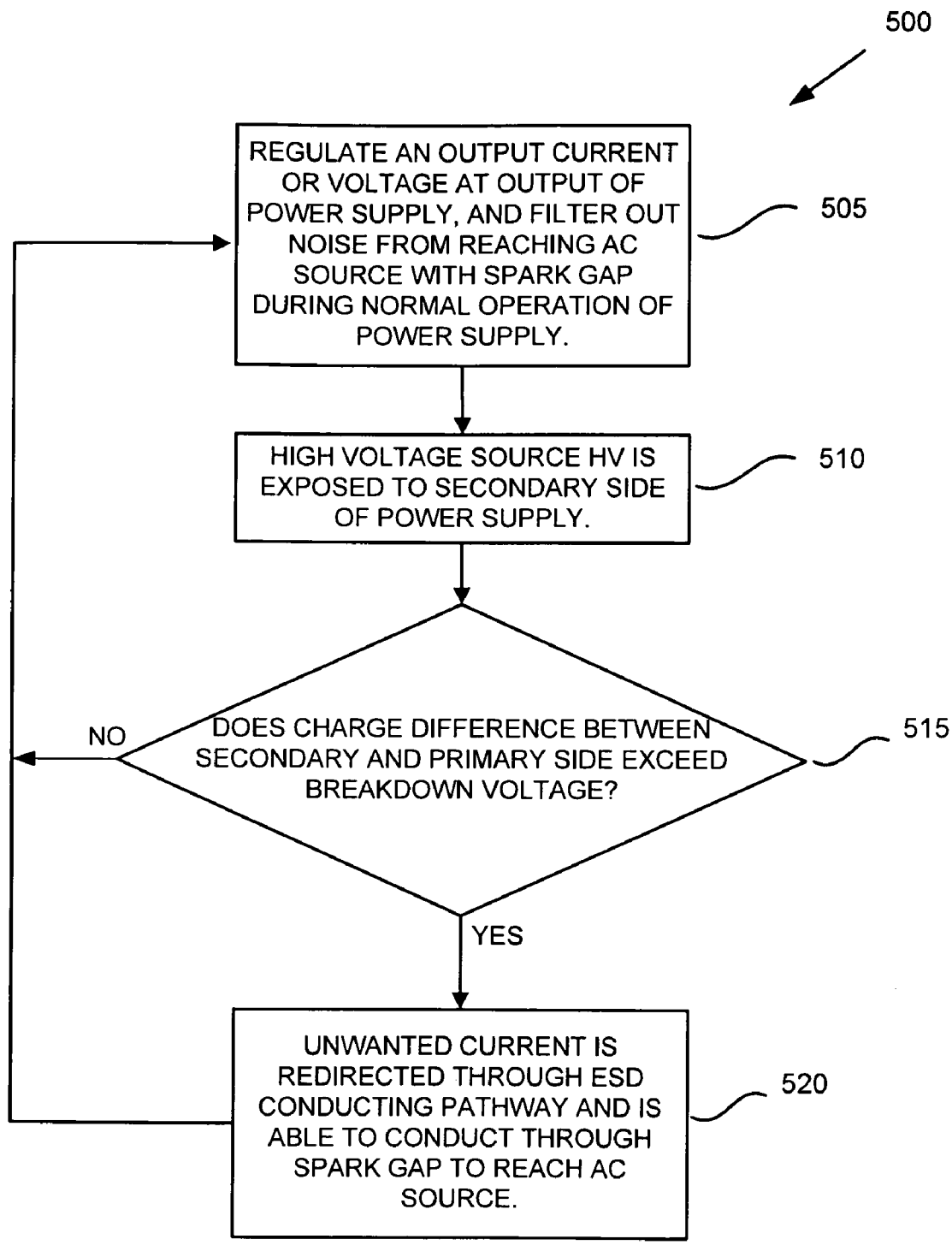
FIG. 5 is a flow chart illustrating a process of redirecting current from an ESD event, in accordance with an embodiment of the invention.

FIG. 5 is a flow chart illustrating a process 500 of operating a power supply having a printed circuit board layout, in accordance with an embodiment of the present invention. Process 500 represents one possible implementation of operation of any of the power supplies discussed herein (e.g., 100, 200, 300, or 400).

In a process block 505 an output voltage or current is regulated at an output of the power supply while a spark gap disposed in an ESD conducting pathway prevents the coupling of noise produced from electrical components of the power supply during normal operation from entering AC source 122. In a process block 510, a high voltage source HV is exposed to the secondary side of the power supply. In decision block 515, if the charge difference between the secondary and primary side exceeds the breakdown voltage, unwanted current is redirected through ESD conducting pathway and is able to conduct through spark gap to reach AC source in process block 520. In process block 520, unwanted current generated from an ESD event is redirected to the ESD conducting pathway and is able to conduct through the spark gap to reach input terminal of the power supply. However, if the charge difference between the secondary and primary side does not exceed the breakdown voltage of the power supply, then an ESD even does not take place and control proceeds back to process block 505 and continues to regulate an output current or voltage until the next high voltage source is exposed to the secondary side of the power supply.

The order in which some or all of the process blocks appear in each process should not be deemed limiting. Rather, one of ordinary skill in the art having the benefit of the present disclosure will understand that some of the process blocks may be executed in a variety of orders not illustrated.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation

What is claimed is:

1. A printed circuit board configured to receive electrical components including a transformer, the printed circuit board comprising:
a primary region to be coupled to an AC source;
a secondary region;

an isolation region disposed between the primary region and the secondary region to galvanically isolate the primary region from the secondary region;

an electrostatic discharge (ESD) conducting pathway included in the primary region to redirect current to the AC source that crosses the isolation region, wherein the ESD conducting pathway includes a first conductive segment adjacent to the isolation region and wherein the first conductive segment is configured to not be connected to the transformer; and a spark gap included in the ESD conducting pathway, the spark gap to filter noise and to provide a current path to the AC source for the current that crosses the isolation region.

2. The printed circuit board of claim 1, wherein the electrical components to be included in the primary region are to form a power supply circuit.

3. The printed circuit board of claim 1, wherein the spark gap has a breakdown voltage high enough to substantially prevent noise from the electrical components from coupling to the AC source and low enough to allow the current that crosses the isolation region to reach the AC source.

4. The printed circuit board of claim 1, wherein the spark gap provides a current path to the AC source only in response to an ESD event.

5. The printed circuit board of claim 1, wherein the ESD conducting pathway includes the first conductive segment bordering the isolation region and a second conductive segment coupled to the first conductive segment.

6. The printed circuit board of claim 5, wherein the first conductive segment has a length that boarders the isolation region and is substantially less than a length of the isolation region.

7. The printed circuit board of claim 5, wherein the second conductive segment borders a periphery of the printed circuit board.

8. The printed circuit board of claim 1, wherein the spark gap is a first spark gap, the printed circuit board further comprising a second spark gap included in the ESD conducting pathway to filter noise and to provide a current path to the AC source for the current that crosses the isolation region.

9. The printed circuit board of claim 1, wherein the spark gap is disposed between a first and a second edge of a ground portion and a floating portion of the ESD conducting pathway.

10. The printed circuit board of claim 1, wherein a width of the spark gap is substantially smaller than a width of the isolation region.

11. A power supply, comprising:
a printed circuit board, including:
a primary region to be coupled to an AC source;
a secondary region;
an isolation region disposed between the primary region and the secondary region to galvanically isolate the primary region from the secondary region;
an electrostatic discharge (ESD) conducting pathway included in the primary region to redirect current to the AC source that crosses the isolation region, wherein the ESD conducting pathway includes a first conductive segment adjacent to the isolation region; and
a spark gap included in the ESD conducting pathway, the spark gap to filter noise and to provide a current path to the AC source for the current that crosses the isolation region; and electrical components included in the primary and secondary regions of the printed circuit board, wherein at least one of the electrical components is a transformer having a primary winding coupled to the primary region and a secondary winding coupled to the secondary region and wherein the first conductive segment of the ESD conducting pathway is not connected to the transformer.

12. The power supply of claim 11, wherein at least one of the electrical components in the primary region is sensitive to ESD.

13. The power supply of claim 12, wherein the at least one electrical component sensitive to ESD is a power supply controller integrated circuit.

14. The power supply of claim 11, wherein the spark gap has a breakdown voltage high enough to substantially prevent noise from the electrical components from coupling to the AC source and low enough to allow the current that crosses the isolation region to reach the AC source.

15. The power supply of claim 11, wherein the ESD conducting pathway includes the first conductive segment boarding the isolation region and a second conductive segment coupled to the first conductive segment.

16. The power supply of claim 15, wherein the second conductive segment borders a periphery of the printed circuit board.

17. The power supply of claim 15, wherein the spark gap is a first spark gap, the printed circuit board further including a second spark gap included in the ESD conducting pathway to filter noise and to provide a current path to the AC source for the current that crosses the isolation region.

18. The power supply of claim 11, wherein the ESD conducting pathway is coupled to redirect current that crosses the isolation region to an electrical ground of the AC source.

19. A method, comprising:
providing an output voltage or current at an output of a power supply in response to an AC source coupled to an input terminal of the power supply;
redirecting current with an electrostatic (ESD) conducting pathway having a spark gap, the ESD conducting pathway redirecting the current to the input terminal and wherein the current is current that crosses an isolation region of a printed circuit board of the power supply, wherein the ESD conducting pathway includes a first conductive segment adjacent to the isolation region and wherein the first conductive segment is not connected to a transformer of the power supply; and
filtering-out noise received in the ESD conducting pathway with the spark gap.

20. The method of claim 19, further comprising galvanically isolating the AC source from the input terminal with the spark gap.

21. The method of claim 19, wherein the spark gap has a breakdown voltage high enough to substantially prevent the noise from coupling to the input terminal and low enough to allow the current that crosses the isolation region to reach the input terminal.

22. The method of claim 19, wherein redirecting current with the ESD conducting pathway includes providing a current path with the spark gap only in response to an ESD event.

23. The method of claim 19, wherein redirecting current with the ESD conducting pathway includes providing a current path at least partially boarding a periphery of the printed circuit board.

* * * * *